US006166662A

United States Patent [19]

Chuang

[11] Patent Number: 6,166,662

[45] Date of Patent: Dec. 26, 2000

[54] STRUCTURE OF KEY PAD

[76] Inventor: Wen-Hao Chuang, No 13, Ta-Chuan 2nd Lane, Jen-Wen, Hsiang, Kaoshiung Hsien, Taiwan

[21] Appl. No.: 09/153,452

[22] Filed: Sep. 15, 1998

[51] Int. Cl.[7] .................................................... H03M 11/00

[52] U.S. Cl. ........................... 341/22; 341/20; 200/206.1; 200/302.2; 200/512; 379/451

[58] Field of Search .................................. 341/21, 20, 22; 200/302.1, 302.2, 302.3, 512, 304; 379/451, 368

[56] References Cited

U.S. PATENT DOCUMENTS 4,501,936 2/1985 Morse ..................................... 379/451
4,734,679 3/1988 Haskins ..................................... 341/22
4,862,499 8/1989 Jerkot et al. ............................ 379/368
5,738,450 4/1998 Lukosch .................................. 400/495

*Primary Examiner*—Michael Horabik
*Assistant Examiner*—Albert K. Wong
*Attorney, Agent, or Firm*—Varndell & Varndell, PLLC

[57] ABSTRACT

A key pad includes a membrane circuit, a flat frame mounted on the membrane circuit to hold a set of key switches in respective openings on the flat frame, each key switch having a key body molded in one opening on the flat frame, a key cap integral with the key body at the top and carrying a respective sign, a rubber cone integral with the key body at the bottom, and an electrically conductive element integral with the rubber cone on the inside for triggering a respective contact at the membrane circuit upon each down stroke of the respective key switch.

5 Claims, 4 Drawing Sheets

STRUCTURE OF KEY PAD

BACKGROUND OF THE INVENTION

The present invention relates to a key pad for an electronic apparatus, and more particularly to such a key pad which is water proof and practical in use, and which has a simple structure convenient for maintenance.

A key pad for an electronic apparatus is generally comprised of a circuit board, a flat frame, and a set of key switches respectively mounted in respective holes on the flat frame. When one key switch is clicked, a respective contact at the circuit board is triggered, causing the circuit board to output a corresponding electrical signal. Because the key switches consist of a number of parts and are respectively installed in the respective holes on the flat frame, gaps exist in the key switches through which water may pass to the inside of the holes to wet the circuit board. Further, the parts of the key switches tend to be jammed in the holes on the flat frame during operation.

SUMMARY OF THE INVENTION

The present invention provides a key pad which eliminates the aforesaid drawbacks. According to one embodiment of the present invention, the key pad includes a membrane circuit, a flat frame mounted on the membrane circuit to hold a set of key switches in respective openings on the flat frame, each key switch having a key body molded in one opening on the flat frame, a key cap integral with the key body at the top and carrying a respective sign, a rubber cone integral with the key body at the bottom, and an electrically conductive element integral with the rubber cone on the inside for triggering a respective contact at the membrane circuit upon each down stroke of the respective key switch. Because the key switches are made in integrity and directly molded in the respective openings on the flat frame, the whole structure of the key pad is simple. Because the key switches are suspended in the openings on the flat frame and respectively supported within a respective locating frame, each key switch can be smoothly and vertically compressed to trigger a respective contact at the membrane circuit accurately. Because the key switches are directly molded in the openings on the flat frame, the openings are sealed when the key switches are installed, therefore no water is allowed to pass to the membrane circuit. Furthermore, the protection and guide of the locating flanges and the effect of the rubber cones greatly prolong the service life of the key switches and improve the accuracy of the operation of the key switches.

DETAILED DESCRIPTION OF THE PREFERRED EMBODIMENT

Figure 2:
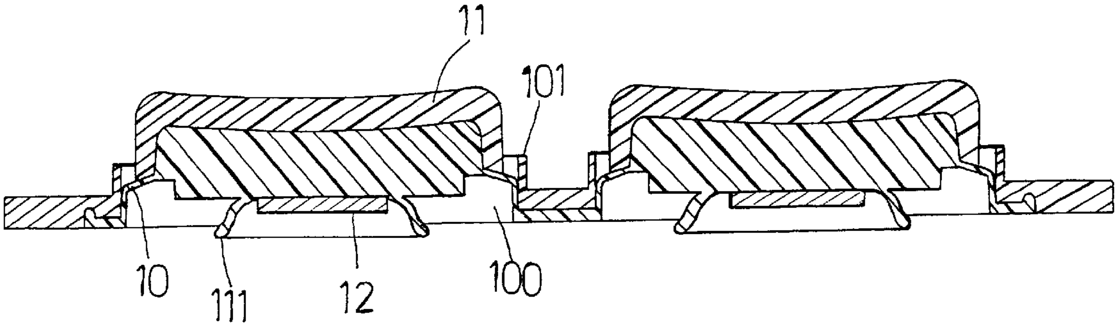
FIG. 2 is a transverse view in section of FIG. 1.
Figure 1:
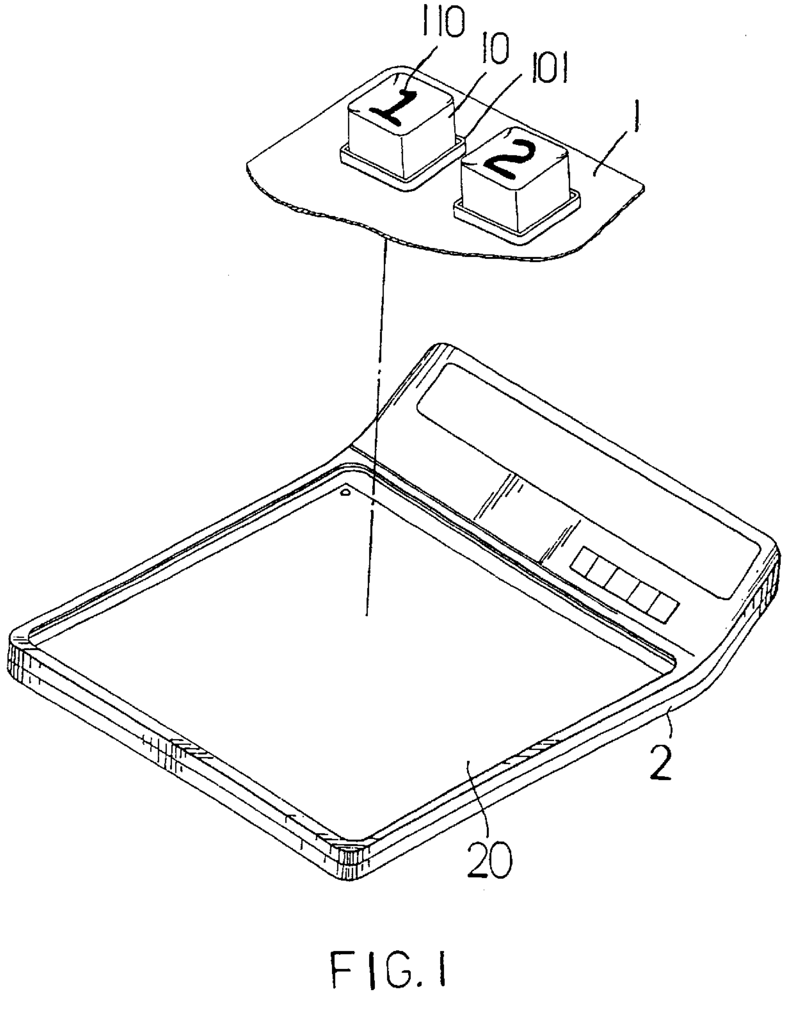
FIG. 1 is a perspective view of a part of a key pad according to the present invention.

Referring to FIGS. 1 and 2, a flat frame 1 is mounted on a membrane circuit (or circuit board) 20 in a casing 2 for, for example, a calculator (see also FIG. 5), having a plurality of openings 100 and a plurality of locating flanges 101 respectively raised from the top side thereof around each opening 100. Flexible plastic or rubber key bodies 10 are respectively molded in the openings 100. Plastic or rubber key caps 11 are respectively integral with the key bodies 10 at the top side and suspended outside the openings 100. The key caps 11 each are respectively marked with a particular sign 110. Hollow plastic or rubber cones 111 are respectively integral with the key bodies 10 at the bottom side and suspended inside the openings 100. The flexible key bodies 10 and flexible key caps 11 can be made from plastic and rubber materials conventionally used in keyboards and key pads in the art, as long as they are sufficiently flexible to properly function in the present invention. Electrically conductive element 12, which can be made from a plastic or rubber material containing electrically conductive carbon powder, is fixedly mounted in each rubber cone 111 on the inside.

Figure 3:
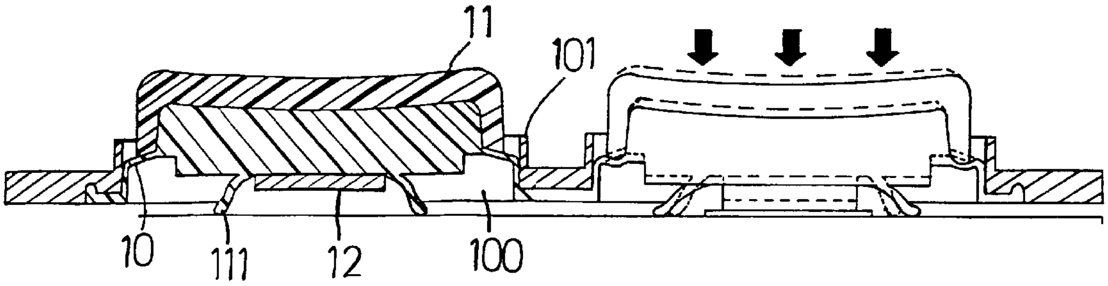
FIG. 3 is similar to FIG. 2 but showing one key cap depressed.
Figure 5:
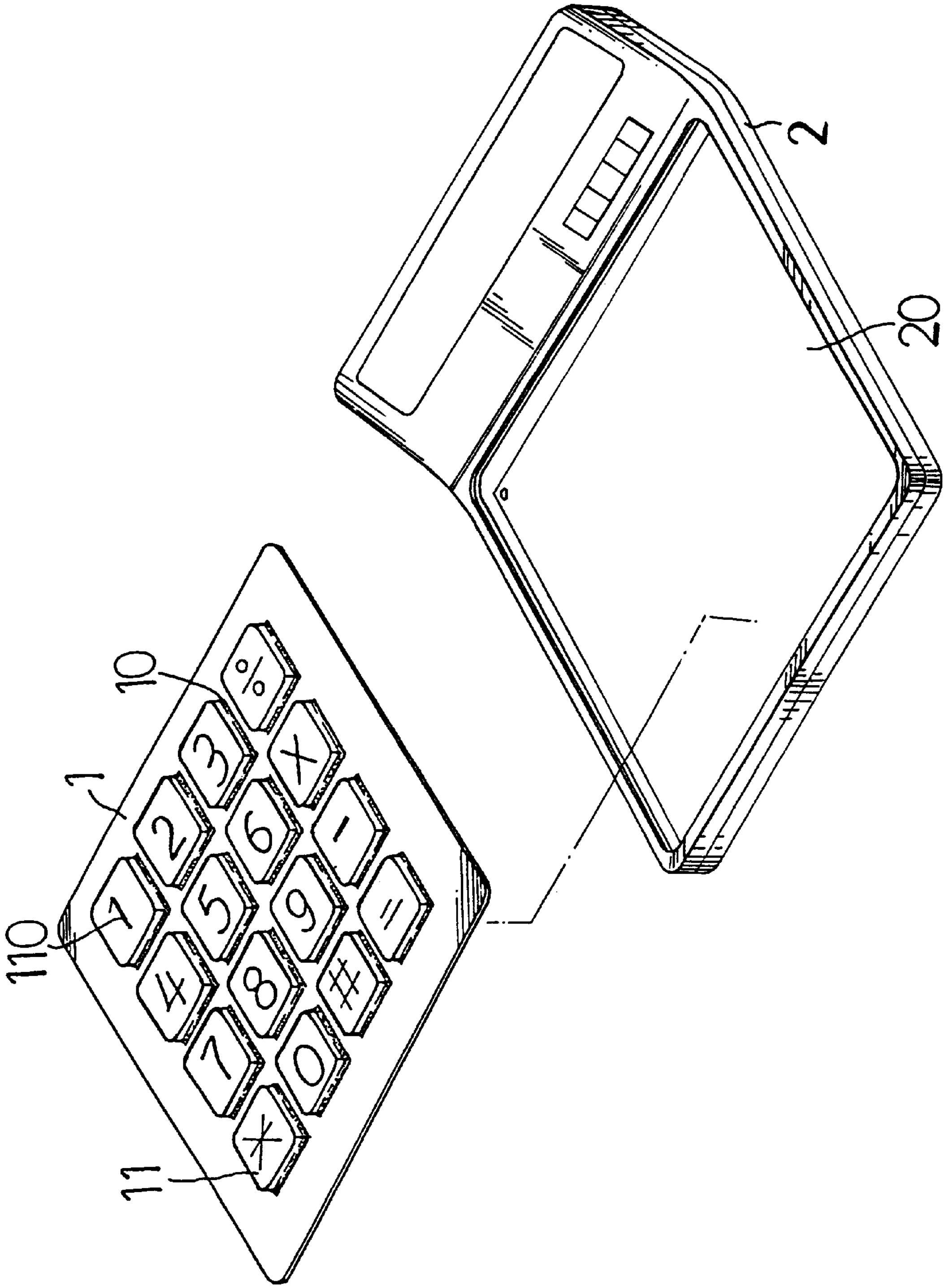
FIG. 5 shows the installation of the key pad in a casing for a calculator according to the present invention.

Referring to FIGS. 3 and 5, when one key cap 11 is depressed, the electrically conductive element 12 in the corresponding rubber cone 111 is forced downwards to contact a respective contact at the membrane circuit 20, causing the membrane circuit 20 to output a corresponding electrical signal.

Referring to FIGS. 1, 2 and 5 again, because the key bodies 10 are directly molded in the openings 100, no gap exists in the openings 100, and no water is allowed to pass to the membrane circuit. Because the electrically conductive element 12 is integral with the corresponding rubber cone 111 on the inside and the rubber cone 111 is integral with the corresponding key body 10 at the bottom, depressing the key cap 11 causes the corresponding electrically conductive element 12 to be directly lowered to contact the corresponding contact at the membrane circuit 20. Further, because the key bodies 10 are molded in the openings 100 and protected within the respective locating flanges 101, the key bodies 10 can be smoothly vertically compressed.

Figure 4:
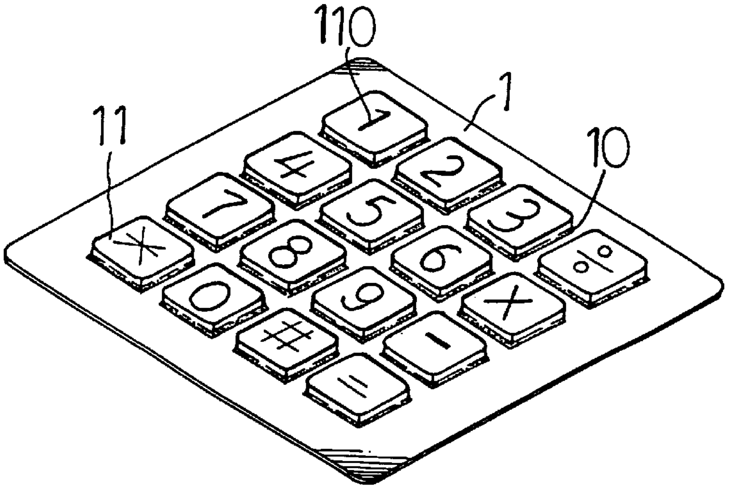
FIG. 4 is a perspective view of an alternate form of the key pad (the membrane circuit excluded).
Figure 7:
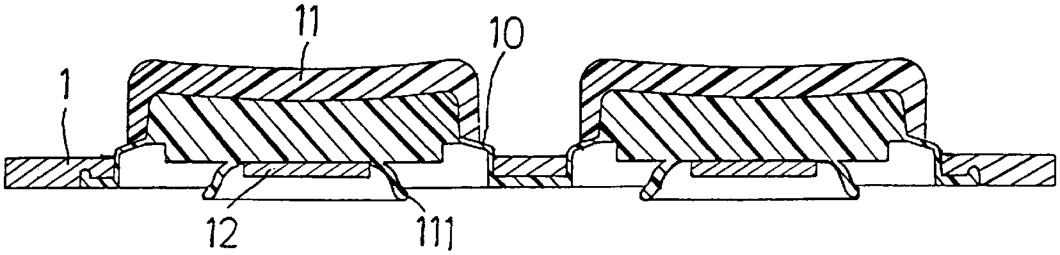
FIG. 7 is a sectional view showing another alternate form of the present invention where the locating flanges are eliminated from the flat frame.

Referring to FIGS. 4, 5 and 7, the aforesaid locating flanges 101 may be eliminated from the flat frame 1.

Figure 6:
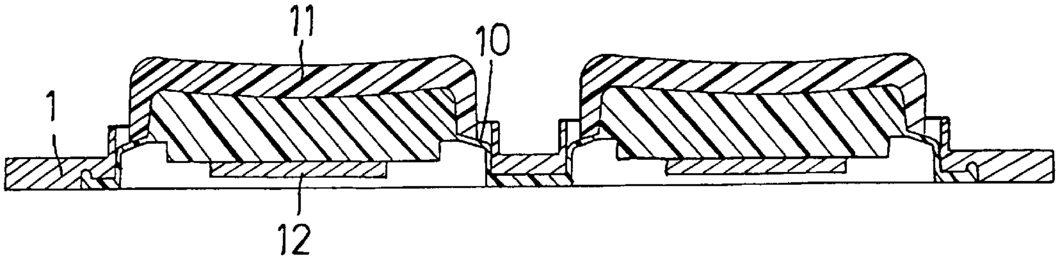
FIG. 6 is a sectional view showing one alternate form of the present invention where the rubber cones are eliminated from the key bodies.

Referring to FIG. 6, the aforesaid rubber cones 111 are eliminated from the key bodies 10, and the electrically conductive elements 12 are respectively directly integral with the key bodies 10 at the bottom.

What is claimed is:

1. A keypad comprising a circuit board, a flat frame with openings mounted on said circuit board, and an integrally formed set of key switches with individual keys switches respectively arranged in said openings of said flat frame;

said integrally formed set of key switches including a plurality of flexible key bodies, a plurality of key caps respectively arranged on said plurality of key bodies, and a plurality of electrically conductive elements respectively arranged below said flexible key bodies and facing a respective contact of said circuit board below said flat frame, said plurality of key caps respectively having a sign thereon;

said plurality of flexible key bodies being interconnected, and said integrally formed set of key switches being sealed to said flat frame by molding so that no water can pass to said circuit board; and said plurality of flexible key bodies respectively having a peripheral part extending to said circuit board and providing an open area between a respective said electrically conductive element and said circuit board.

2. The keypad according to claim 1, wherein said flat frame is made of flexible material, and said locating flanges are made of rigid material.

3. The keypad according to claim 1, wherein said flat frame comprises a plurality of locating flanges respectively around said openings and extending upward away from said circuit board.

4. The keypad according to claim 1, wherein said plurality of flexible key bodies respectively have a hollow cone extending to said circuit board and arranged about a respective said electrically conductive element.

5. The keypad according to claim 1, wherein a slot is provided in said circuit board and said hollow cone is received in said slot.

* * * * *